(12) United States Patent
Elian et al.

(10) Patent No.: US 8,952,489 B2
(45) Date of Patent: Feb. 10, 2015

(54) SEMICONDUCTOR PACKAGE AND METHOD FOR FABRICATING THE SAME

(71) Applicant: Infineon Technologies AG, Neubiberg (DE)

(72) Inventors: Klaus Elian, Alteglofsheim (DE); Jens Pohl, Bernhardswald (DE); Horst Theuss, Wenzenbach (DE); Renate Hofmann, Regensburg (DE); Alexander Glas, Munich (DE); Carsten Ahrens, Pettendorf (DE)

(73) Assignee: Infineon Technologies AG, Neubiberg (DE)

( * ) Notice: Subject to any disclaimer, the term of this patent is extended or adjusted under 35 U.S.C. 154(b) by 160 days.

(21) Appl. No.: 13/647,740

(22) Filed: Oct. 9, 2012

(65) Prior Publication Data

US 2014/0097514 A1    Apr. 10, 2014

(51) Int. Cl.

| H01L 21/56 | (2006.01) |
| H01L 23/498 | (2006.01) |
| H01L 23/495 | (2006.01) |
| H01L 23/522 | (2006.01) |
| H01L 23/29 | (2006.01) |

(52) U.S. Cl.
USPC ........... 257/531; 257/773; 257/774; 257/659; 257/737; 257/666; 438/127; 438/107

(58) Field of Classification Search
USPC ................ 257/531, 738, 427, 773, 774, 659; 431/113, 3; 438/113, 3, 107, 126
See application file for complete search history.

(56) References Cited

U.S. PATENT DOCUMENTS

| 7,994,608 | B2* | 8/2011 | Tan et al. ...................... 257/531 |
| 8,513,771 | B2* | 8/2013 | Elian et al. .................... 257/531 |
| 2002/0005565 | A1* | 1/2002 | Forbes et al. ................... 257/531 |
| 2005/0224972 | A1* | 10/2005 | Domon et al. ................. 257/737 |
| 2006/0152911 | A1* | 7/2006 | Humbert et al. ............... 361/782 |
| 2006/0249754 | A1* | 11/2006 | Forman et al. ................ 257/208 |
| 2007/0085648 | A1* | 4/2007 | Lee et al. ....................... 336/200 |
| 2008/0099903 | A1* | 5/2008 | Shen .............................. 257/686 |
| 2009/0072388 | A1* | 3/2009 | Tews et al. .................... 257/724 |
| 2009/0261452 | A1* | 10/2009 | Tsujimoto et al. ............ 257/531 |
| 2010/0109123 | A1* | 5/2010 | Strzalkowski et al. ....... 257/531 |
| 2010/0230784 | A1* | 9/2010 | Teggatz et al. ................ 257/531 |
| 2011/0127998 | A1* | 6/2011 | Elian et al. .................... 324/219 |
| 2012/0032298 | A1* | 2/2012 | Miyagawa et al. ........... 257/531 |
| 2012/0038025 | A1* | 2/2012 | Teggatz et al. ................ 257/531 |
| 2012/0038065 | A1* | 2/2012 | Butz et al. ..................... 257/784 |
| 2012/0086102 | A1* | 4/2012 | Hofmann et al. ............. 257/531 |
| 2014/0084414 | A1* | 3/2014 | Jezewski et al. .............. 257/531 |

* cited by examiner

*Primary Examiner* — Shaun Campbell
*Assistant Examiner* — Thai T Vuong
(74) *Attorney, Agent, or Firm* — Slater & Matsil, L.L.P.

(57) ABSTRACT

A semiconductor package includes a semiconductor chip, an inductor applied to the semiconductor chip. The inductor includes at least one winding. A space within the at least one winding is filled with a magnetic material.

20 Claims, 15 Drawing Sheets

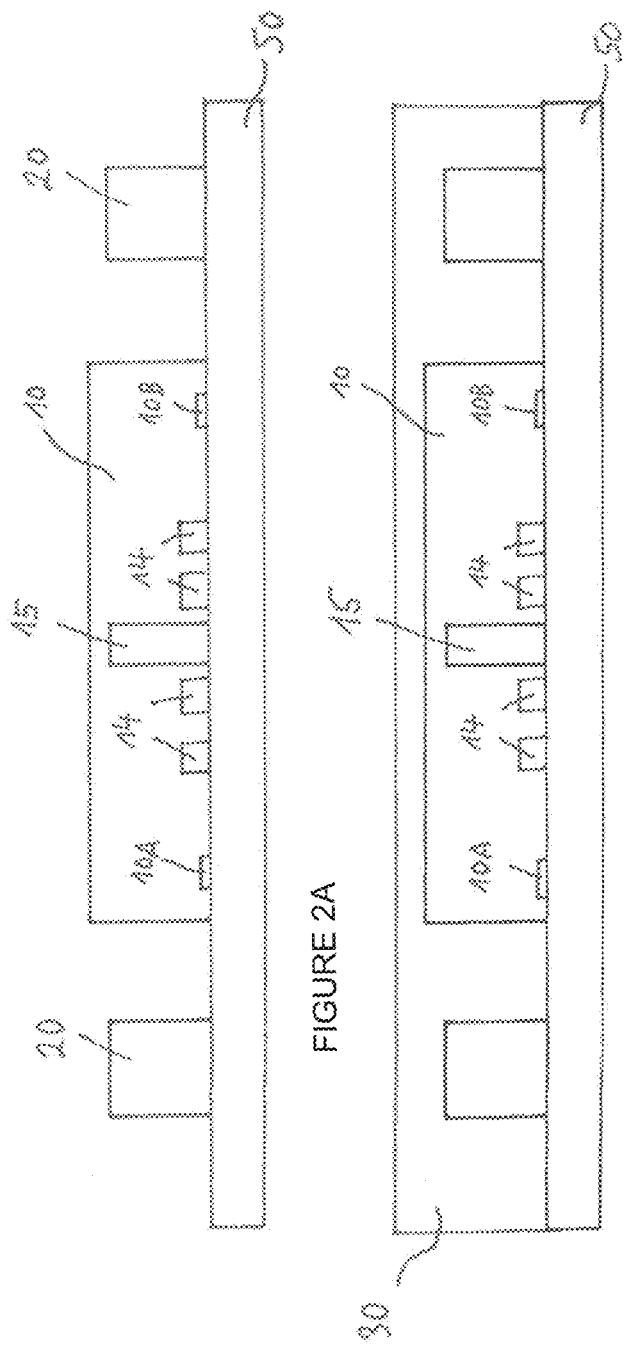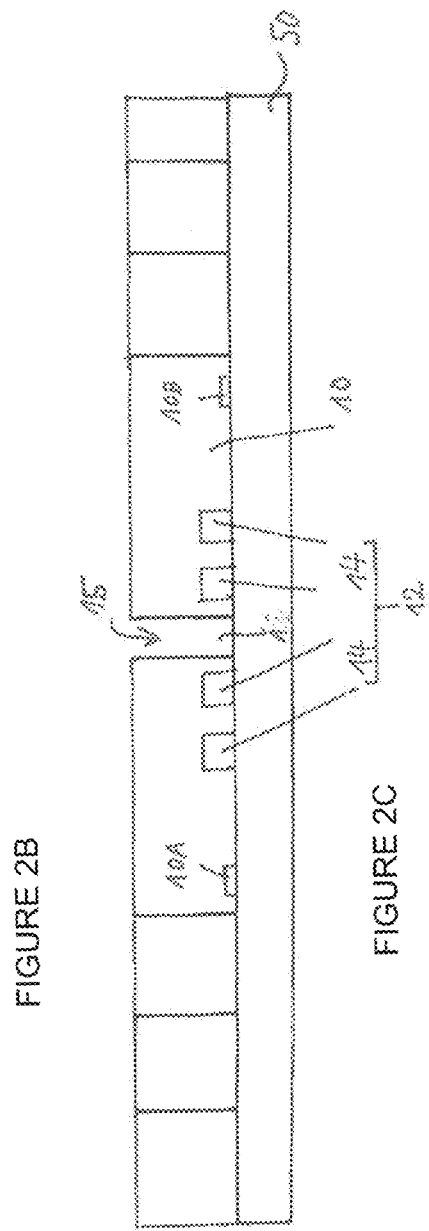

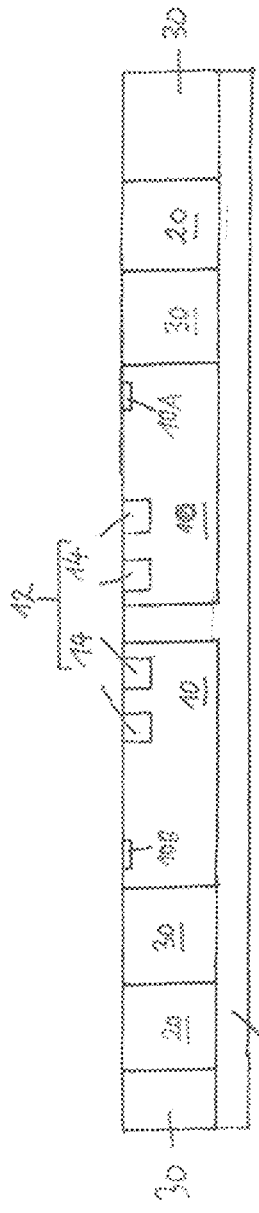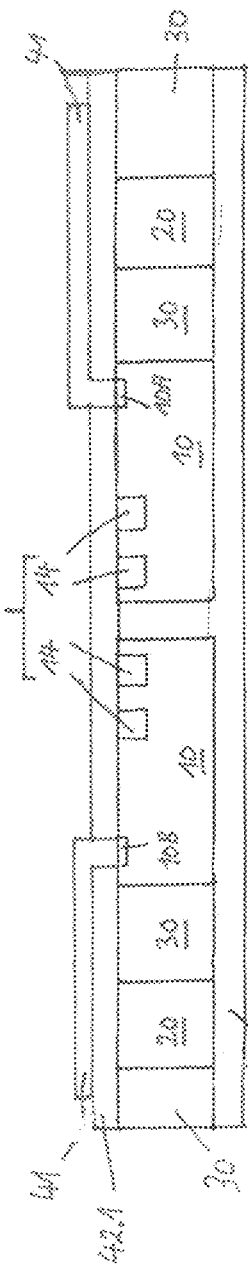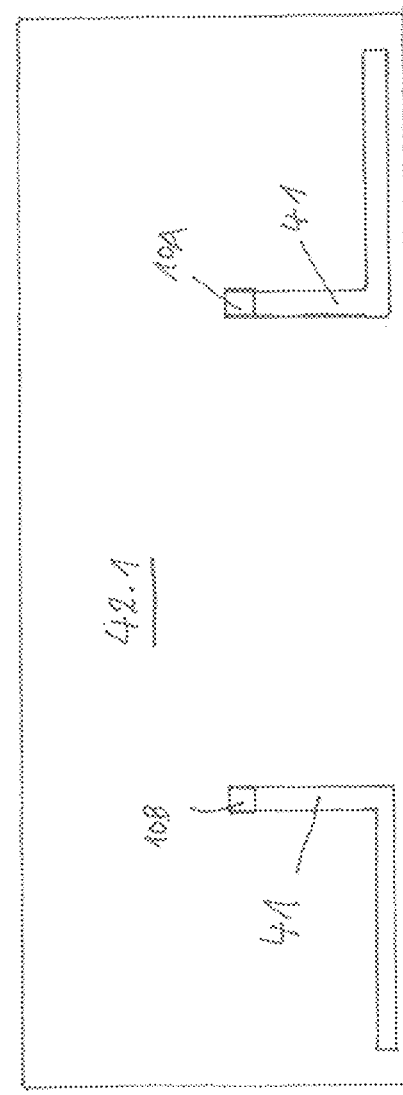
FIGURE 2E
FIGURE 2F
FIGURE 2G

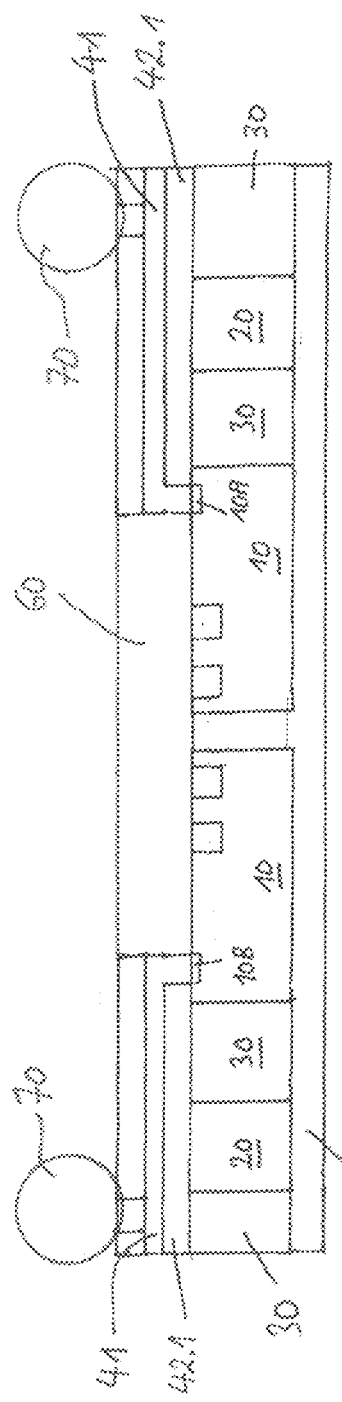
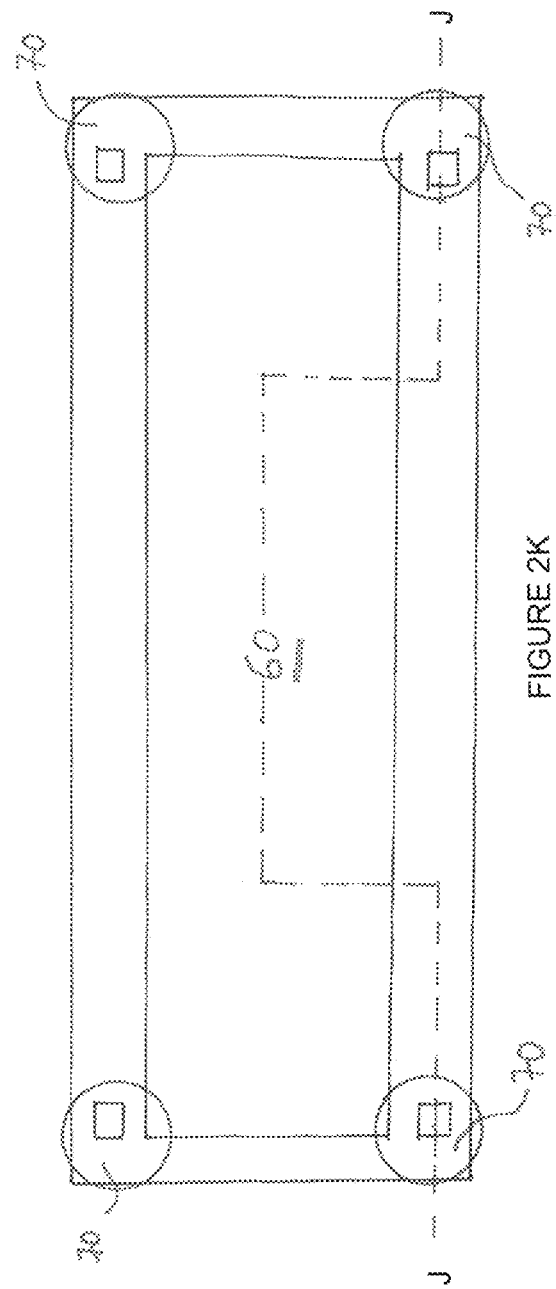

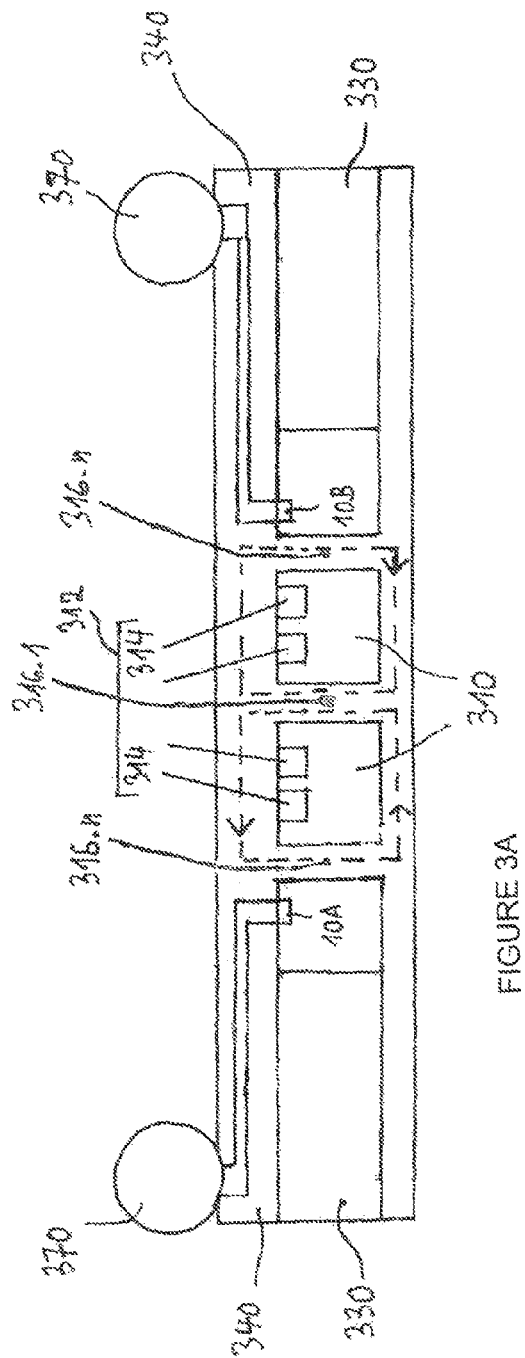
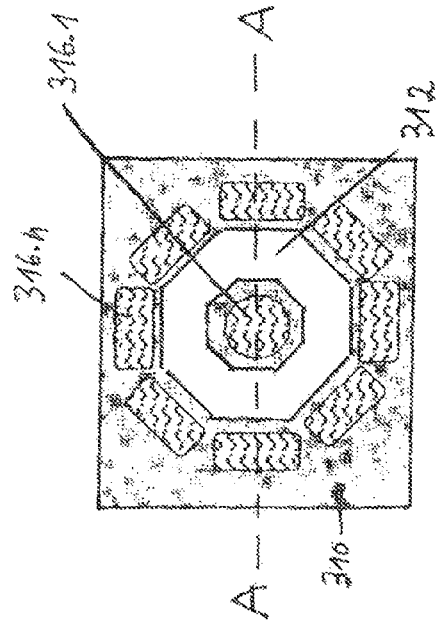
FIGURE 3A
FIGURE 3B

SEMICONDUCTOR PACKAGE AND METHOD FOR FABRICATING THE SAME

TECHNICAL FIELD

The invention relates generally to semiconductor packages, and more particularly to a semiconductor package with an integrated inductor and a method for fabricating the same.

BACKGROUND

Semiconductor chips are encapsulated in a mold compound in order to protect the chips from environmental impacts to ensure reliability and performance. In many applications such as e.g., RF (radio frequency) devices, inductors are coupled to the chips and embedded in the packages. Such packages may become large, sophisticated and expensive. However, both the manufacturers and the consumers of electronic devices desire devices that are inexpensive, reduced in size and yet have increased device functionality.

For these and other reasons, there is a need for the present invention.

BRIEF DESCRIPTION OF THE DRAWINGS

The accompanying drawings are included to provide a further understanding of aspects of the disclosure and are incorporated in and constitute a part of this specification. The drawings illustrate aspects of the disclosure and together with the description serve to explain principles of aspects. Other aspects and examples and many of the intended advantages of aspects will be readily appreciated as they become better understood by reference to the following detailed description. The elements of the drawings are not necessarily to scale relative to each other. Like reference numerals designate corresponding similar parts.

FIG. 1, illustrate an example of a semiconductor package having magnetic elements in a cross-sectional view (FIG. 1A) and a top view (FIG. 1B);

FIGS. 2A-2K, collectively FIG. 2, schematically illustrate an example of a method to produce a semiconductor package of FIG. 1A, 1B;

FIGS. 3A-3B, collectively FIG. 3, illustrate an example of a semiconductor package having a semiconductor chip with multiple holes in a cross-sectional view (FIG. 3A) and in a partial in-plane cross-sectional view (FIG. 3B);

FIG. 5, illustrate examples of semiconductor packages in partial in-plane cross-sectional views, respectively; FIG. 6, illustrate examples of semiconductor packages in partial in-plane cross-sectional views, respectively.

DETAILED DESCRIPTION OF ILLUSTRATIVE EMBODIMENTS

Figure 1A:
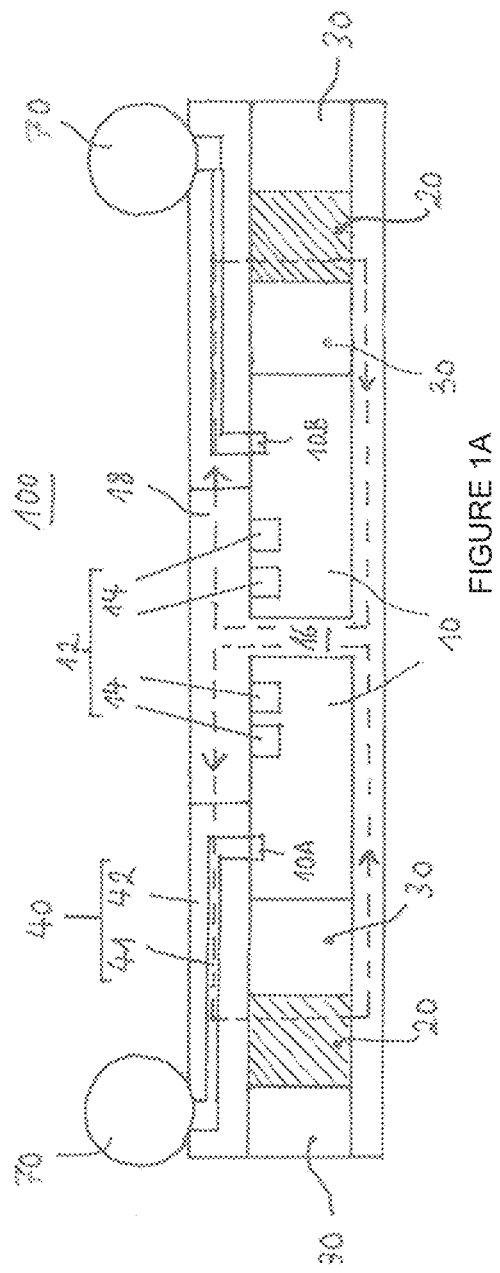
FIGS. 1A and 1B, collectively

Aspects and examples are now described with reference to the drawings, wherein like reference numerals are generally utilized to refer to like elements throughout. In the following description, for purposes of explanation, numerous specific details are set forth in order to provide a thorough understanding of one or more aspects of the disclosures. It may be evident, however, to one skilled in the art that one or more aspects of the disclosure may be practiced with a lesser degree of the specific details. In other instances, known structures and elements are shown in schematic form in order to facilitate describing one or more aspects of the disclosure. The following description is therefore not to be taken in a limiting sense, and the scope is defined by the appended claims. It should also be noted that the representations of the various layers, sheets, cavities or substrates in the figures are not necessarily drawn to scale.

In the following detailed description, reference is made to the accompanying drawings, which form a part thereof, and in which specific examples are shown by way of illustration. In this regard, directional terminology, such as e.g., "upper," "lower," "top," "bottom," "left-hand," "right-hand," "front side," "backside," etc., is used with reference to the orientation of the figure(s) being described. Because components of examples can be positioned in a number of different orientations, the directional terminology is used for purposes of illustration and is in no way limiting. It is to be understood that other examples may be utilized and structural or logical changes may be made without departing from the scope as defined in the claims.

It is to be understood that the features of the various examples described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described further below may be of different types, may be manufactured by different technologies and may include for example integrated electrical circuits, electro-optical circuits, electro-mechanical circuits such as e.g., MEMS (Micro-Electro-Mechanical System) and/or passives. The semiconductor chips described herein may include RF (radio frequency) circuits, control circuits, logic circuits or microprocessors. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals.

According to one aspect, an encapsulation material is provided. The encapsulation material may at least partially cover the semiconductor chip to form an encapsulation body. The encapsulation material may be based on a polymer material, i.e., may comprise a basis material (also referred to as matrix material in the following) made of any appropriate duroplastic, thermoplastic or thermosetting material or laminate (prepreg). In particular, a matrix material based on epoxy resin may be used. The matrix material may contain a filler material, e.g., $SiO_2$ particles, to adjust physical properties of the encapsulation body such as e.g., CTE (coefficient of thermal expansion). The encapsulation material can be comprised of a non-magnetic material. Alternatively, the encapsulation material can be comprised of a magnetic material. In particular, the matrix material may embed a magnetic substance, e.g., in form of magnetic particles. The magnetic substance or particles may be made of iron, nickel and/or molybdenum or mixtures and/or alloys of these materials. By way of example, iron, nickel or molybdenum powder particles may be contained in the encapsulation material. The particles may be coated with an insulating shell in order to avoid short circuits.

After its deposition, the encapsulation material may be hardened by a heat treatment. Various techniques may be employed to form the encapsulation body by the encapsulation material, for example compression molding, transfer molding, injection molding, powder molding, liquid molding, dispensing or laminating.

After deposition, the encapsulation material may be cured to form the solid encapsulation body. The space within the at least one winding of the inductor can be filled with a magnetic material. The relative magnetic permeability (i.e., the ratio of the permeability of the magnetic material to the permeability of the free space) of the winding core made of the magnetic material may be high (between 60-150), medium (between 20-60) and low (between 3-20) depending on the application. The inductance of the inductor may be more than one or tens of μH.

According to one example, the inductor is integrated in the semiconductor chip. To this end, a main surface of the semiconductor chip may be provided with a winding trench filled with metal.

According to one example, the inductor may be externally attached to the semiconductor chip. To this end, wires representing coil windings may be placed (e.g., deposited or wire-bonded) on a main surface of the semiconductor chip.

In these and other examples, the winding core of the inductor is filled with the magnetic material which can be comprised of a matrix material embedding magnetic particles. Thus, a part of the magnetic material body may form the magnetic winding core of the inductor. It is further possible that magnetic material is disposed outside the winding so that magnetic materials inside and outside the winding and the magnetic elements constitute or form part of a magnetic winding core.

According to an example, one central hole is formed in the semiconductor chip which central hole comprises the space within the winding and can be formed as a through-hole extending from a first main face to a second main face of the semiconductor chip. It is also possible that at least one further hole is formed in the semiconductor chip which can also be formed as a through-hole. This at least further hole can also be filled with the magnetic material. Also in this case magnetic material can be disposed outside the holes so that magnetic materials inside and outside the holes constitute or form part of a magnetic winding core. In this case no previously disposed magnetic elements would be necessary.

The magnetic material can also be disposed outside of the hole or holes formed in the semiconductor chips. In these and other examples, the winding core of the inductor.

The encapsulation material may be used to produce fan-out type packages. In a fan-out type package at least some of the external contact pads and/or conductor lines connecting the semiconductor chip to external contact pads of the package are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

One or more metal layers having the shape of conductor lines (or conductor tracks or traces) may be placed over the semiconductor chip and the encapsulation body. The metal layers may, for example, be used to produce an electric redistribution structure. The conductor lines may be employed as wiring layers to make electrical contact with the semiconductor chip from outside the semiconductor package and/or to make electrical contact with other semiconductor chips and/or components contained in the semiconductor package. The conductor lines may couple contact pads of the semiconductor chip to the external contact pads. The conductor lines may be manufactured with any desired geometric shape and any desired material composition. Any desired metal, for example aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers such as e.g., dielectric polymer layers.

Figure 1B:
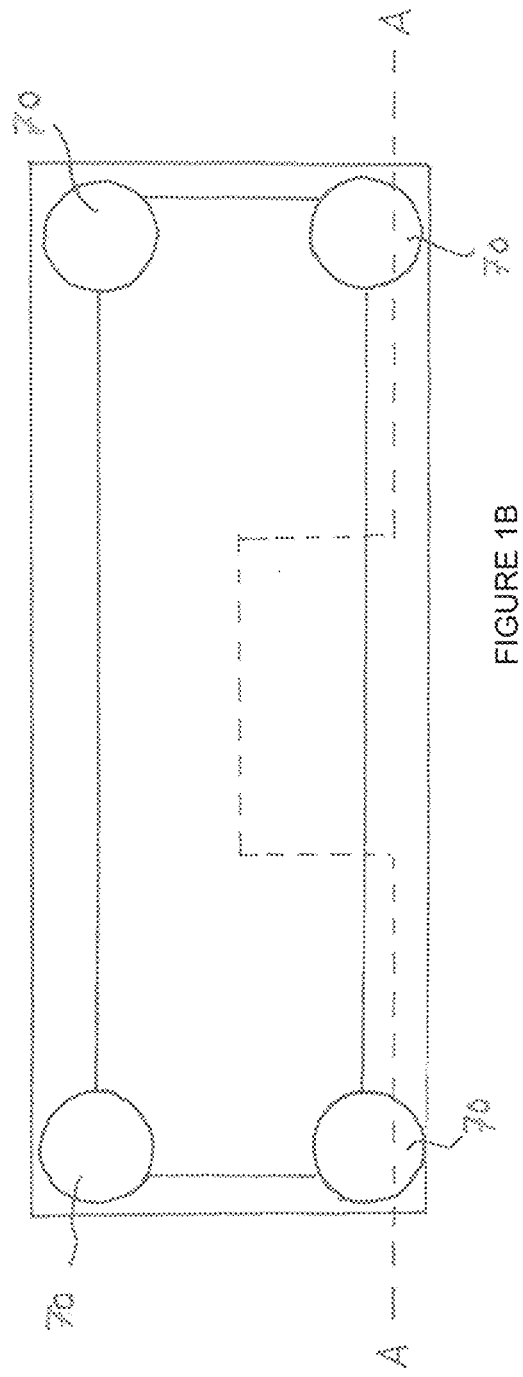

FIG. 1A schematically illustrates a semiconductor package 100 in cross-section and FIG. 1B shows a top view of the semiconductor package 100. The cross-section of FIG. 1A has been taken along the dashed line of FIG. 1B. The semiconductor package 100 includes a semiconductor chip 10 and an inductor 12 applied to the semiconductor chip 10, the inductor 12 comprising at least one winding 14. A space 16 within the at least one winding 14 is filled with a magnetic material 18.

More specifically, the at least one winding 14 (in FIG. 1A, by way of example, 2 windings are depicted) may be integrated in the semiconductor chip 10. To this end, one or more winding trenches may be generated in a first main face of the semiconductor chip 10. Each one of the winding trenches may have any desired geometry and dimensions depending, for example, on the desired current load and/or magnetic field strength and/or application. By way of example, a width of a winding trench may be about 2 μm, 5 μm, 10 μm or more, and a depth of a winding trench may e.g., be about 10 μm, 30 μm, 50 μm or more. An aspect ratio of e.g., of 10 or more may be obtained. The winding trench and thus the windings 14 may have e.g., a continuous, spiral extension. The plan view shape of a winding 14 may be circular, polygonal, etc. The windings 14 form a coil which may be used as an inductance, e.g., in RF devices, as a frequency filter or in any other suitable applications. Further, multiple inductors 12 or coils may be formed in or connected to the semiconductor chip 10.

The winding trench may be filled with any electrically conducting material, e.g., a metal or an electrically conductive polymer material. In one embodiment, by way of example, the winding trench may be filled with copper or aluminum.

It is to be noted that the semiconductor chip 10 may be provided with chip contact pads 10A and 10B. Such chip contact pads are typically coupled to an integrated circuit (not illustrated) formed in the semiconductor chip 10 and/or to the windings 14 of the inductor 12. Without saying, an integrated circuit formed in the semiconductor chip 10 may be also electrically coupled to the windings 14 of the inductor 12 by chip-internal wiring.

The semiconductor chip 10 may comprise a hole, e.g., a through-hole, comprising the space within the at least one winding 14 that is filled with the magnetic material 18. The hole can thus extend from a first main face to an opposite second main face of the semiconductor chip 10 and it can be located in a center of the windings 14. Moreover, the hole can have any desired cross-sectional shape like, e.g., a square or quadratic or circular shape.

The semiconductor package 100 may further comprise at least one magnetic element 20 located at a distance from the semiconductor chip 10. In the example of a semiconductor package 100, as shown in FIG. 1A, the semiconductor package 100 comprises two magnetic elements 20, each one located at a distance from the semiconductor chip 10 so that the magnetic elements 20 are located in an opposite relationship to each other with the semiconductor chip 10 between them. The magnetic elements 20 may be located in such a way that each one of them constitute a part of a magnetic winding core in combination with the magnetic material 18 filled in the space 16 within the at least one winding 14. The magnetic elements 20 may be comprised of a soft-magnetic material like, e.g., a soft-magnetic material comprising Fe, Ni, FeNi, FeSiB, Co, CoFe, or ferrite material.

The semiconductor package 100 may further comprise an encapsulation body 30 formed of an encapsulation material, the encapsulation material covering side faces of the semiconductor chip 10. As shown in the example of a semiconductor package 100 of FIGS. 1A, 1B, the encapsulation body 30 may be arranged in such a way that it only covers the side faces of the semiconductor chip 10 and not the first and second main faces. The encapsulation material of the encapsulation body 30 may be comprised of a non-magnetic material.

The magnetic material 18 filled into the space within the at least one winding 14 may comprise a soft-magnetic material. In particular, it may comprise a polymer material embedding magnetic particles like soft-magnetic particles. The polymer material may be filled with ferrite particles like Zn ferrite particles. The magnetic particles may have microscopic or nanoscopic size.

The magnetic material 18 filled into the space 16 within the at least one winding 14 may also extend over one or both of the first and second main faces of the semiconductor chip 10 in such a way that it covers one or both of the first and second main faces partially or completely. In the example of a semiconductor package 100, as shown in FIG. 1A and as will be clear in FIGS. 2A to 2K, the magnetic material 18 covers completely the first main face of the semiconductor chip 10 and the second main face of the semiconductor chip 10. Moreover, it extends completely over a lower surface of the semiconductor package 100 in the example as shown in FIG. 1A.

The semiconductor package 100 may further comprise an electrical redistribution structure 40 having at least one structured metal layer 41 and one polymer layer 42, wherein the redistribution structure 40 extends over the first main face of the semiconductor chip 10. The electrical redistribution structure 40 may be arranged so as to electrically connect each one of the contact pads 10A and 10B with solder balls 70 applied onto an upper surface of the redistribution structure 40. As shown in FIG. 1B, four solder balls 70 are arranged onto the upper surface of the redistribution structure 40 as an example.

As can be seen in the example of a semiconductor package 100 of FIG. 1A, the electrical redistribution structure 40 can be arranged in such a way that the magnetic material 18 extending over the first main face of the semiconductor chip 10 is arranged coplanar with the polymer layer 42 or, in other words, upper surfaces of the magnetic material 18 and the polymer layer 42 are coplanar with each other and lower surfaces of the magnetic material 18 and the polymer layer 42 are coplanar with the first main face of the semiconductor chip 10. The magnetic material 18 and the magnetic elements 20 may form together a magnetic winding core as indicated by the two dashed lines with arrows. The magnetic field lines may extend only through the magnetic material 18 and the magnetic elements 20.

Figure 2D:
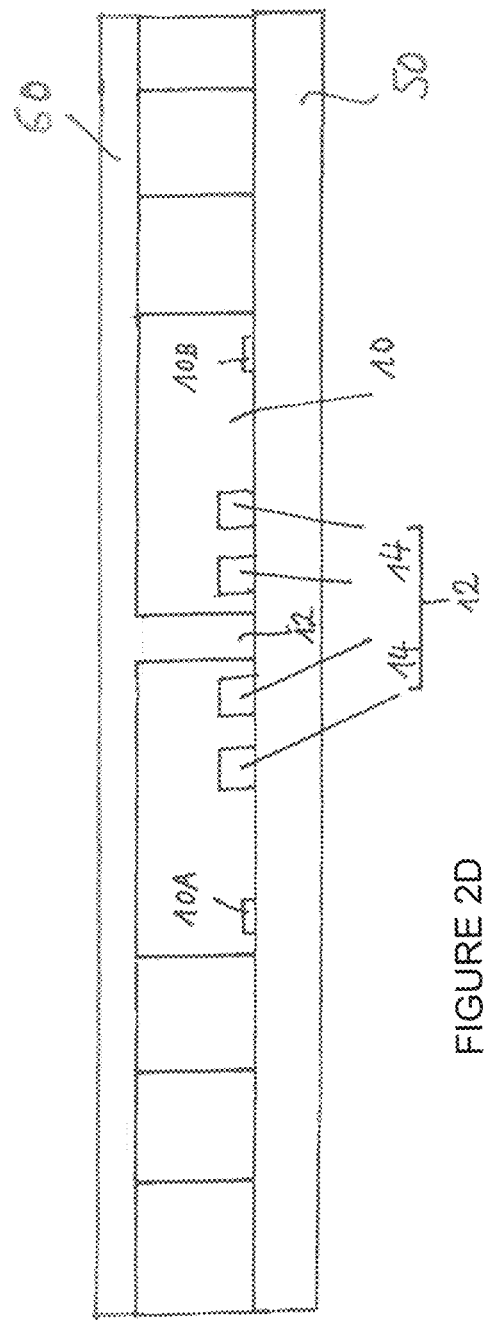

FIGS. 2A-2K schematically illustrate a method for fabricating a semiconductor package 100 as shown in FIGS. 1A, 1B. First of all, a plurality of semiconductor chips 10, such as that shown in FIG. 2A, is fabricated on a wafer made of a semiconductor material. The semiconductor wafer may include bulk silicon in which integrated circuits may be embedded. Chip contact pads 10A and 10B of each one of the semiconductor chips 10 are located on a first main face of the semiconductor wafer. The integrated circuits can be electrically accessed via the chip contact pads 10A and 10B. The chip contact pads 10A and 10B may be made of a metal, for example aluminum or copper, and may have any desired shape and size. Typically, depending on the integrated circuit, each functional chip region is provided with a plurality of chip contact pads 10A and 10B. The integrated circuits and the chip contact pads 10A and 10B are formed on wafer level during so-called frontend wafer processing.

Winding trenches and holes 15 may be formed in each functional chip region on wafer level. The production of the winding trenches and holes 15 can be effected in many different ways which may, among others, depend on the material of the wafer. For example, RIE (reactive iron etching) or electro-chemical etching may be used to produce the winding trenches and holes 15. Instead of electro-chemical etching or RIE etching, other hole or trench formation techniques may be employed for the production of the trenches and holes 15. In principle, all the formation methods known in micro-mechanics such as, for example, drilling, laser drilling, ultrasonic drilling or sand blasting can be used for this purpose.

By way of example, the wafer may have a thickness within the range of 25-2000 µm, and optionally, within the range of 50-250 µm. The holes 15 may have a diameter within the range of 2-200 µm, and optionally, with the range of 30-100 µm, e.g., about 50 µm. The ratio of hole length to hole diameter (aspect ratio) may lie within the range of 2-1000, and optionally relatively large aspect ratios above e.g., 5, 10 or even 100 may be available. It is to be noted that the hole 15 may be a blind hole or a through-hole. Typically, the hole 15 does at least extend in a space within the winding trench. The depth of the hole 15 may e.g., be equal or greater than the depth of the winding trench.

An electrically conducting material is introduced into the winding trench to form the windings 14 of the inductor 12 (FIG. 1A). In one embodiment the electrically conducting material may be introduced by galvanic plating wherein a seed layer may be deposited in the wiring trench and a further layer may be galvanically deposited onto the seed layer. The further layer may be made of e.g., copper and may have a thickness to completely fill the wiring trench. As an alternative to the galvanic plating process, an electroless plating process such as electroless nickel-palladium plating may be used. Electroless plating is also referred to as chemical plating in the art. Further, other deposition methods such as physical vapor deposition (PVD), chemical vapor deposition (CVD), sputtering, or printing may be employed to fill the winding trench with an electrically conducting material.

The functional chip regions of the semiconductor wafer may then be singulated into the semiconductor chips 10 by dicing the wafer and thereby obtaining a plurality of semiconductor chips 10.

In order to package the semiconductor chips 10, a (temporary) carrier 50 may be provided as illustrated in FIG. 2A. The carrier 50 may be a plate made of a rigid material, for example a metal, metal alloy, silicon, glass or plastics. The carrier 50 may have at least one flat surface, and an adhesive tape (not shown), for example a double sided sticky tape, may be laminated onto this surface of the carrier 50. Components of the semiconductor device to be fabricated can be placed on this adhesive tape. The shape of the carrier 50 is not limited to any geometric shape, for example the carrier 50 may be round or square-shaped. The carrier 50 may have any appropriate size. Thus, the molded body (often referred to as "molded reconfigured wafer,") which is formed on the basis of the carrier 50, may e.g., be disc-shaped having a diameter of e.g., 200 or 300 mm, or may have any other shape such as a polygonal shape with the same or other lateral dimensions.

The semiconductor chips 10 are placed on the carrier 50, as shown in FIG. 2A, where only one semiconductor chip 10 is shown. The semiconductor chips 10 can be fixed on the adhesive tape. Alternatively, a glue material or any other adhesive material or mechanical securing means (such as a clamping device or a vacuum generator) may be associated with the carrier 50 and used to fix the semiconductor chip 10. The semiconductor chips 10 may be arranged in an array on the carrier 50, wherein the spacing between neighboring semiconductor chips 10 may be determined according to the desired foot print area of the semiconductor package to be fabricated. The spacing between neighboring semiconductor chips 10 may e.g., be in the range between 0.25 mm and 10 mm. It is to be noted that throughout FIG. 2A-2K only a partial section of carrier 50 and the molded body is illustrated, that is to say in practice, typically much more than two semiconductor chips 10 (e.g., some tens or more than hundred thereof) are placed on the carrier 50.

The semiconductor chips 10 are relocated on the carrier 50 in larger spacings as they have been in the wafer bond. The semiconductor chips 10 may have been manufactured on the same semiconductor wafer, but may alternatively have been manufactured on different semiconductor wafers. Furthermore, the semiconductor chips 10 may be physically identical, but may also contain different integrated circuits and/or represent other components. The semiconductor chips 10 may be arranged over the carrier 50 with their first main faces containing the chip contact pads 10A and 10B facing the carrier 50. In this case, the first main faces and the chip contact pads 10A and 10B may be in direct contact with the adhesive tape or the carrier 50. The semiconductor chips 10 may be placed onto the carrier 50 by means of a pick-and-place machine.

After attaching the semiconductor chips 10 onto the carrier 50, magnetic elements 20 may be placed onto the carrier 50. The magnetic elements 20 may be comprised of soft-magnetic elements which can be made of Fe, Ni, FeNi, FeSiB, Co, CoFe, or ferrite materials. The magnetic elements 20 can be placed in an opposite relationship to each other on two opposing lateral sides of the semiconductor chip 10 and in a lateral distance from respective side faces of the semiconductor chips 10.

After attaching the semiconductor chips 10 and the magnetic elements 20 on the carrier 50, they are encapsulated with an encapsulation material forming a molded body 30 as illustrated in FIG. 2B. The encapsulation material may partly or completely cover the upper main faces of the semiconductor chips 10 and also the side faces of the semiconductor chips 10 and the encapsulation material may completely cover the magnetic elements 20 on all sides. The gaps between the semiconductor chips 10 may also be filled with the encapsulation material. The encapsulation material can be comprised of a conventional encapsulation material like, e.g., an epoxy resin material. For example, the encapsulation material may be a duro-plastic or thermo-setting mold material. In particular, the encapsulation material may be comprised of a non-magnetic material.

After curing, the encapsulation material provides stability to the array of semiconductor chips 10. Various techniques may be employed to cover the semiconductor chips 10 with the encapsulation material. The encapsulation material may, for example, be applied by compression molding, injection molding, granulate molding, powder molding or liquid molding.

As shown in FIGS. 2A and 2B, the vertical sizes of the semiconductor chips 10, the holes 15 and the magnetic elements 20 can be chosen such that the vertical size of the semiconductor chips 10 is greater than the vertical size of the magnetic elements 20 and the vertical size of the holes 15 corresponds to the vertical size of the magnetic elements 20. This allows in a next step, which is shown in FIG. 2C, to partly grind back the mold body 30 and the semiconductor chip 10 from above and thereby open the holes 15. The grinding back is performed down to the upper surfaces of the magnetic elements 20. The grinding process can be done in different ways, one of which can be mechanical polishing or chemical-mechanical polishing (CMP).

In the next step, as shown in FIG. 2D, a magnetic material 60 is covered on the second main faces of the semiconductor chips 10 and on the molded body 30 and filled into the holes 15. It may be possible to cover the whole backside of the molded body 30, in particular the whole reconfigured wafer, with the magnetic material 60. Alternatively, only those parts of the molded body 30 can be covered with the magnetic material 60 which are intended to be fabricated to semiconductor packages 100 such as that shown in FIG. 1A. The magnetic material 60 can be applied by, e.g., printing, stencil printing, screen printing, ink-jet printing or other suitable printing technologies.

Thereafter, as shown in FIG. 2E, the carrier 50 can be removed and the molded body 30 can be turned upside down for fabricating an electrical redistribution structure 40 in the next step.

FIGS. 2F and 2G show a cross-sectional representation of the molded body 30 (FIG. 2F) and a top view of the molded body 30 (FIG. 2G) after a first step of generating an electrical redistribution structure 40. A first dielectric layer 42.1 is deposited onto the entire surface of the molded reconfigured wafer whereafter the first dielectric layer 42.1 is opened in areas where the contact pads 10A and 10B are located and then the opened portions are filled with a metallic material and electrical traces 41 are generated which begin at the metallized openings and end at edge positions of the molded body. The first dielectric layer 42.1 may be fabricated from a polymer, such as polyimide, and it may be deposited from a gas phase. The openings in the first dielectric layer 42.1 may, for example, be produced by using photolithographic methods and/or etching methods. The metallic material may be deposited by galvanic deposition into the openings and also the metallic traces 41 may be fabricated by galvanic deposition.

Figure 2H:
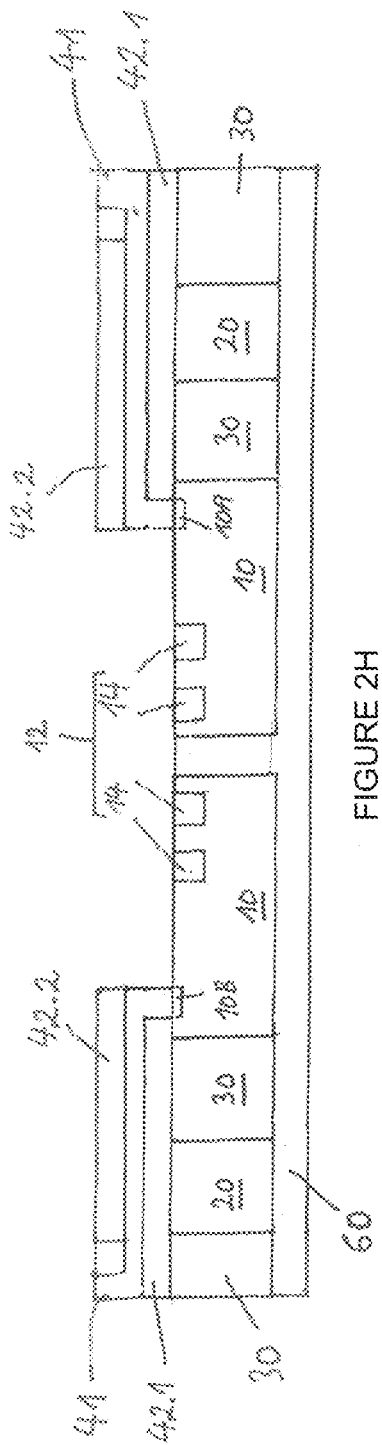
Figure 2I:
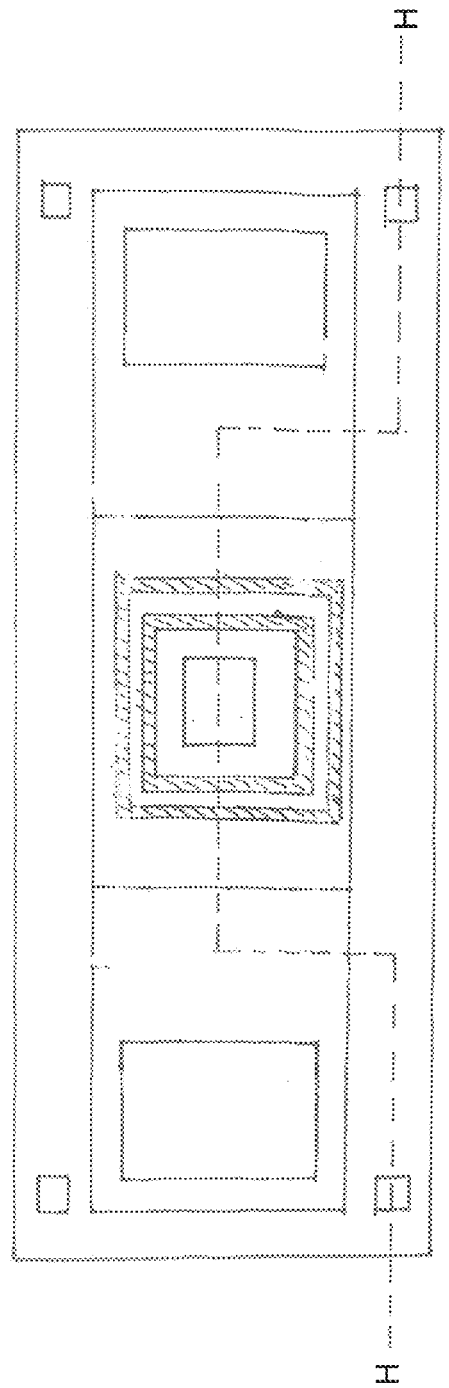

FIGS. 2H and 2I show the result after the second step of the fabrication of the electrical redistribution structure 40. FIG. 2H shows a cross-sectional view along line H-H of FIG. 2I. In the second step a second dielectric layer 42.2 is deposited onto the entire surface of the molded body. The second dielectric layer 42.2 can be fabricated in the same way as the first dielectric layer 42.1. After depositing the second dielectric layer 42.2, openings are formed above end portions of the electrical traces 42.2 and thereafter the openings are filled with a metallic material. Further-on, a large square-shaped opening is formed in the second dielectric layer 42.2 and the underlying first dielectric layer 42.1, wherein the opening can be seen in the top view shown in FIG. 2I, and the opening is generated in such a way that it exposes the upper surfaces of the magnetic elements 20 and the hole 15.

In a next step, as shown in FIGS. 2J and 2K, a magnetic material 60 is filled into the large opening so that magnetic winding cores are generated. FIG. 2J shows a cross-sectional view along line J-J of FIG. 2K. The magnetic material 60 may be comprised of a polymer filled with soft-magnetic particles. In a final step solder balls 70 are deposited onto the metallized openings resulting in a semiconductor package as already shown in FIG. 1A.

FIGS. 3A and 3B show another example of a semiconductor package in a cross-sectional view (FIG. 3A) and in a partial sectional view (FIG. 3B) within a horizontal plane of the inductor. The cross-sectional view of FIG. 3A showing the holes 316.1 and 316.n has been taken along line A-A of FIG. 3B. The semiconductor package 300 of FIGS. 3A and 3B is similar to the semiconductor package 100 of FIGS. 1A, 1B except for the following differences. The semiconductor package 300 does not comprise magnetic elements 20 disposed in a lateral distance to side faces of the semiconductor chip. Instead the semiconductor package 300 comprises a semiconductor chip 310 comprising a plurality of holes 316, wherein the plurality of holes 316 include one central hole 316.1 and non-central holes 316.n. The semiconductor package 300 comprises an inductor 312 applied to the semiconductor chip 310, the inductor 312 comprising at least one winding 314. The central hole 316 comprises a space within the at least one winding 314 which is filled with a magnetic material. The other non-central holes 316.n can also be filled with the magnetic material thereby generating a plurality of magnetic winding cores as indicated by the dashed lines in FIG. 3A. The semiconductor package 300 may also comprise an encapsulation body 330 and an electrical redistribution structure 340 applied onto a first main face of the semiconductor chip 310 and solder balls 370 applied onto exposed metallized portions of the redistribution structure 340.

FIGS. 4A-4I illustrate a method for fabricating the semiconductor package 300. As the fabrication procedure is similar to the procedure as outlined above in connection with FIGS. 2A-2K, only the differences will be outlined in the following.

Figure 4A:
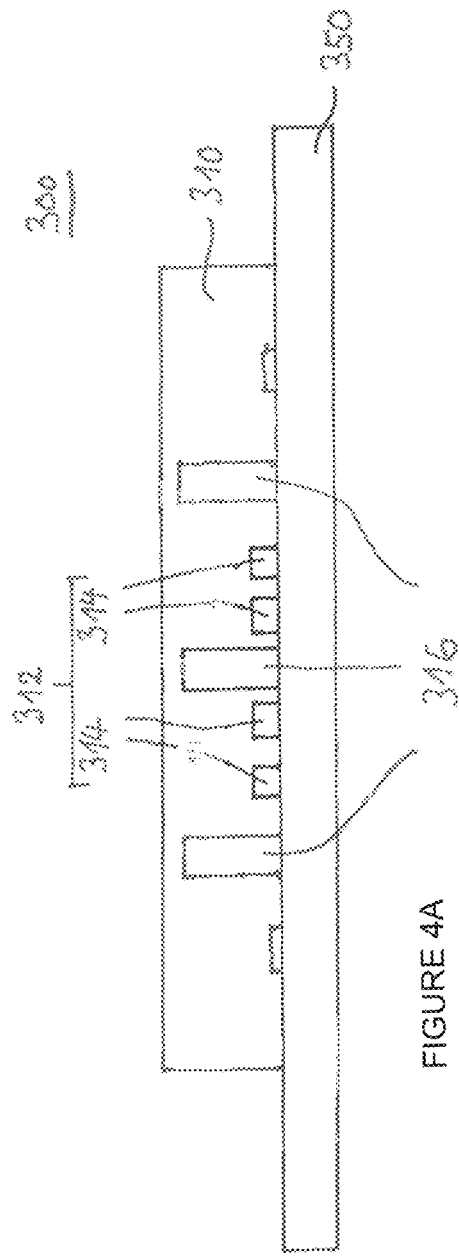
FIGS. 4A-4I, collectively FIG. 4, schematically illustrate an example of a method to produce a semiconductor package of FIGS. 3A, 3B.

In the first step a plurality of semiconductor chips 310 is produced, wherein each one of the semiconductor chips 310 comprises contact pads 310A and 310B, an inductor 312 comprising at least one winding 314, and a plurality of trenches 316. The plurality of semiconductor chips 310 is placed onto a carrier 350 as shown in FIG. 4A. In this way a reconfigured wafer is provided.

Figure 4B:
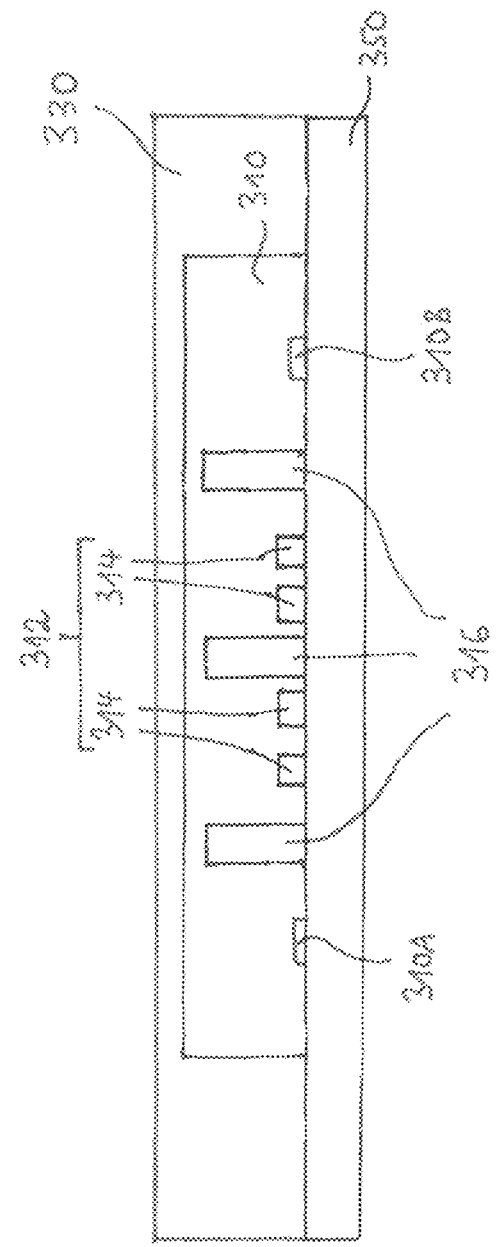

In a next step, as shown in FIG. 4B, the semiconductor chips 310 are covered by an encapsulation material for fabricating an encapsulation body 330. The encapsulation material can again be comprised of a standard, non-magnetic encapsulation material.

Figure 4C:
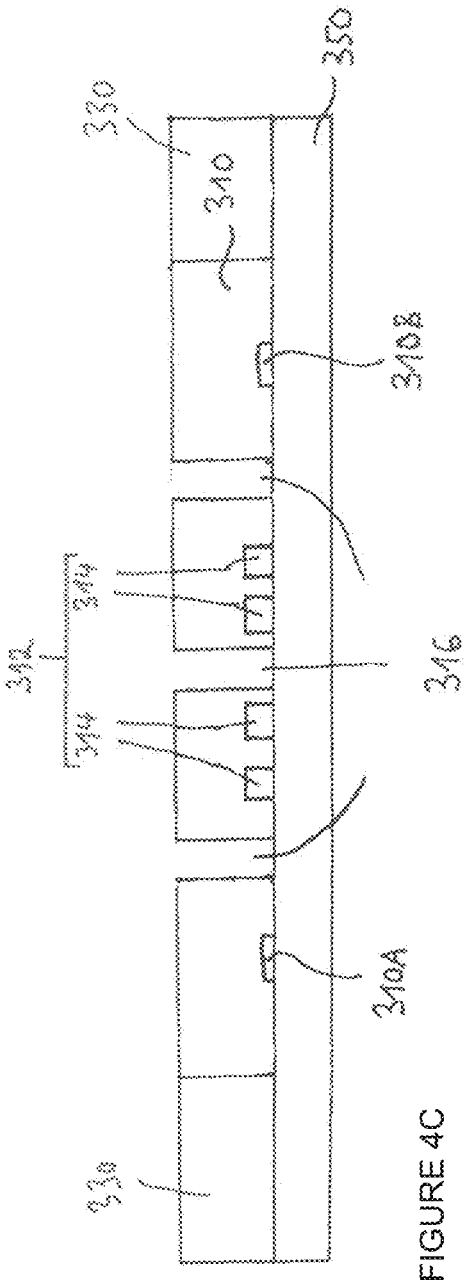

In a next step, as shown in FIG. 4C, the encapsulation body 330 is partially removed from its front surface until the trenches 316 are reached so that a plurality of holes 316 is produced, the holes 316 comprising a central hole 316.1 and a plurality of non-central holes 316.n.

Figure 4D:
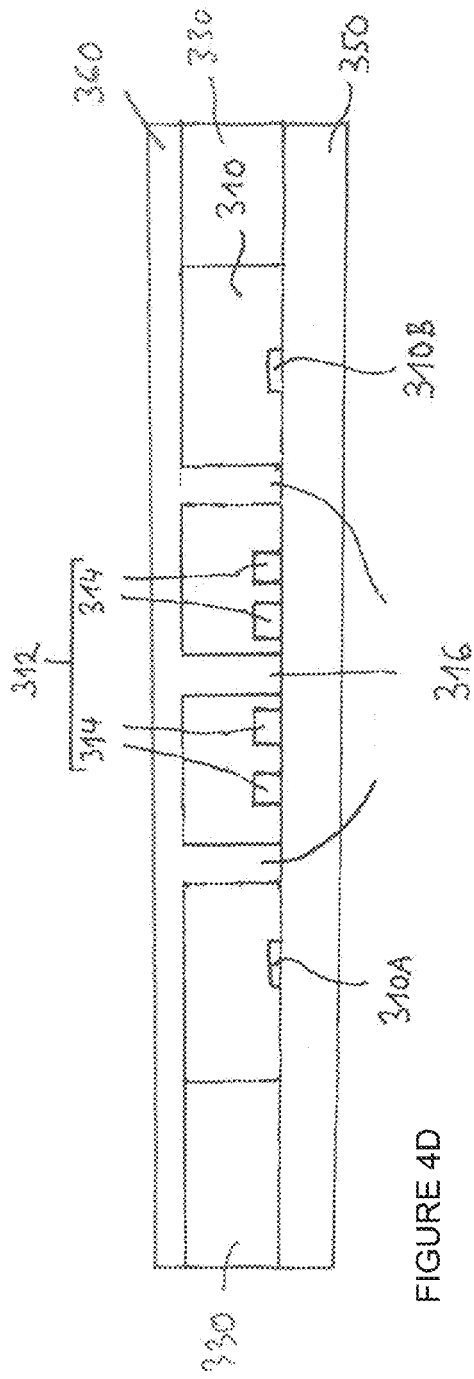

In a next step, as shown in FIG. 4D, a front surface of the encapsulation body 330 is covered by a magnetic material 360 in such a way that the holes 316 are filled with the magnetic material 360 and a layer of the magnetic material 360 is deposited onto the front surface of the semiconductor chips 310 and the encapsulation body 330. The magnetic material 360 can be comprised of a polymer material embedding magnetic particles.

Figure 4E:
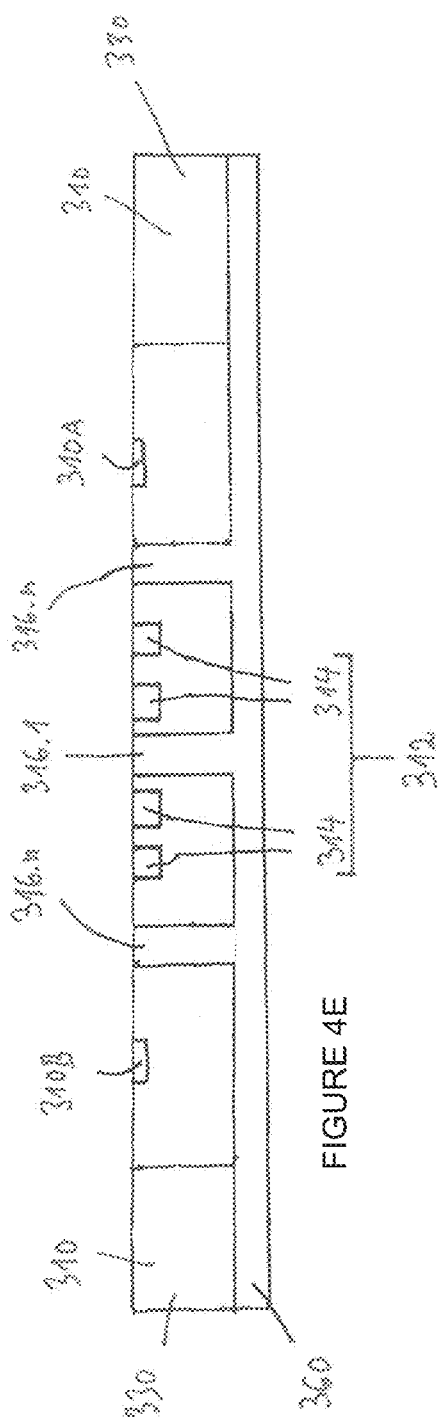

In a next step, as shown in FIG. 4E, the carrier 350 is removed and the encapsulation body 330 is turned upside down.

Figure 4F:
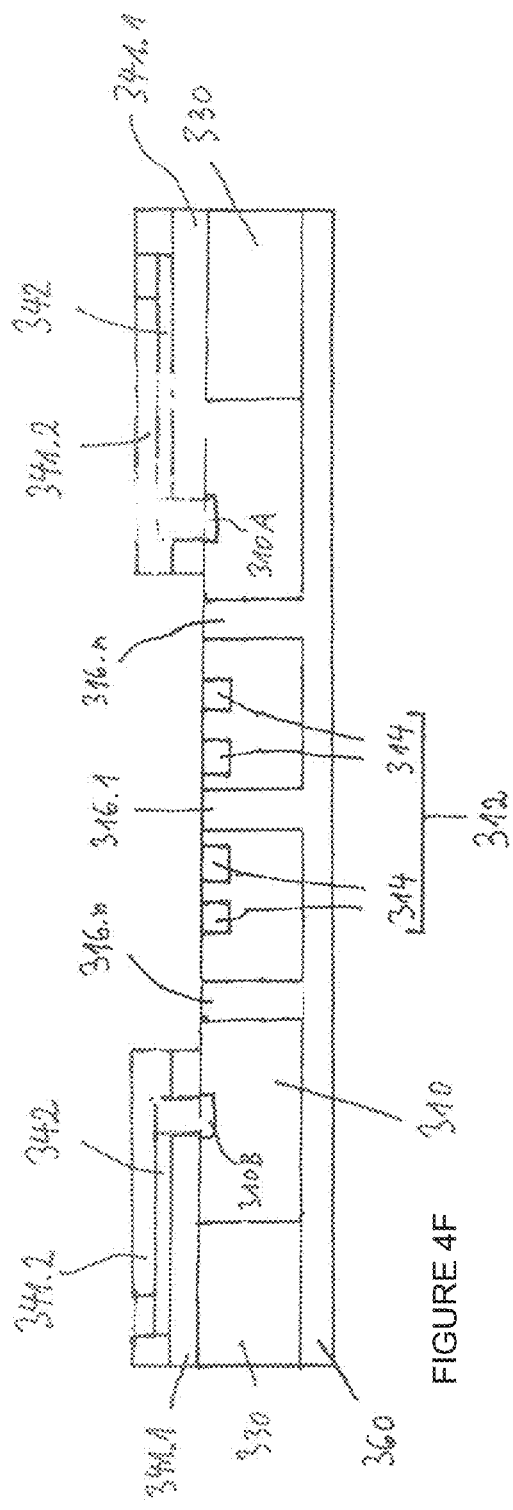
Figure 4G:
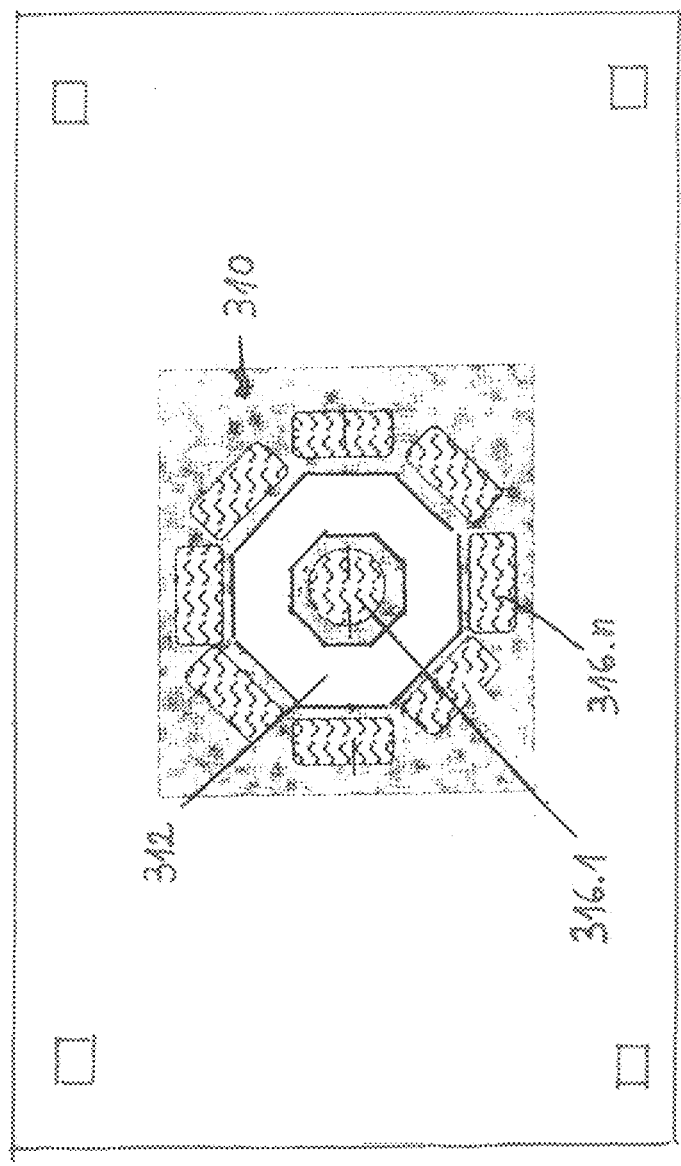

In a next step, as shown in FIGS. 4F and 4G, an electrical redistribution structure is produced. This can be done by first depositing a first dielectric layer 341.1 and forming therein openings which are located above the contact pads 310A and 310B. Thereafter, the openings can be filled with a metallic material. Thereafter, electrical traces 342 can be fabricated which extend from the metallized openings to edge portions on the first dielectric layer 341.1. Thereafter, a second dielectric layer 341.2 can be deposited onto the first dielectric layer 341.1 thereafter openings can be formed in the second dielectric layer 341.2 above end portions of the metallic traces 342. Thereafter, a central portion of the dielectric layers above the holes 316 can be removed.

Figure 4H:
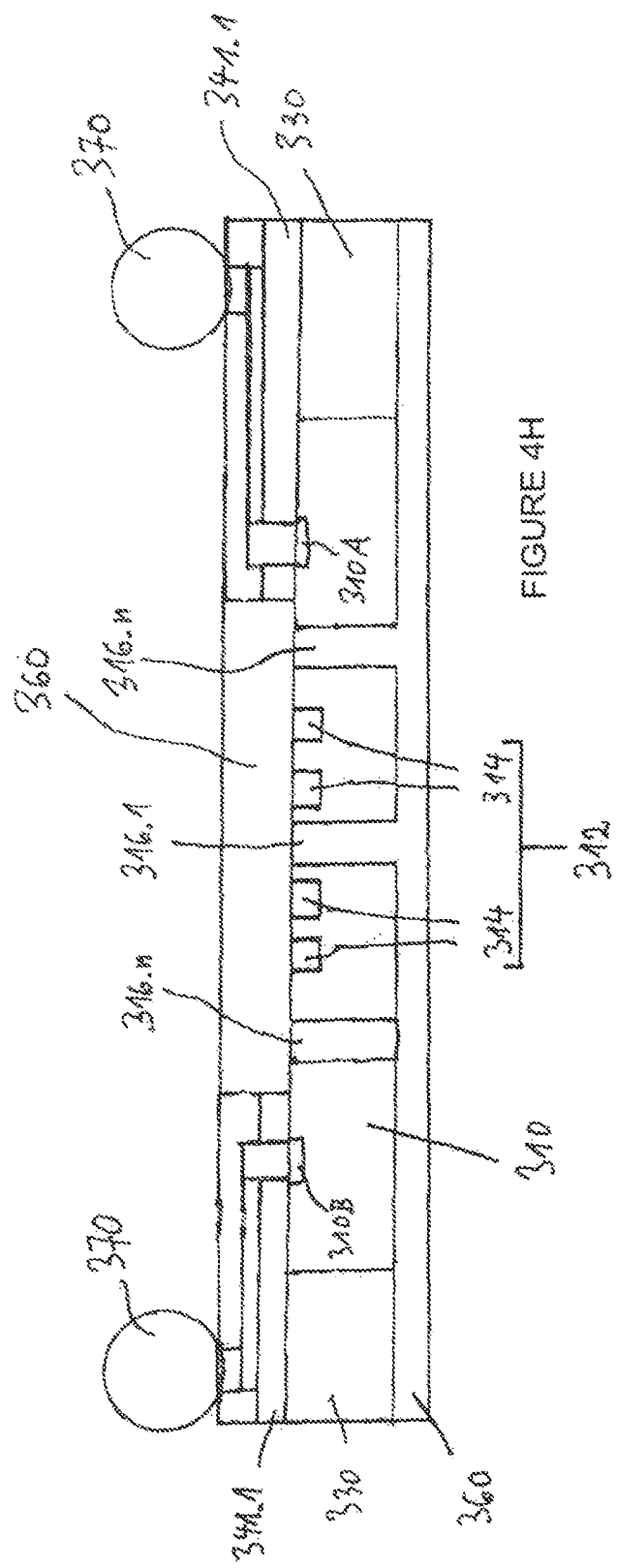
Figure 4I:
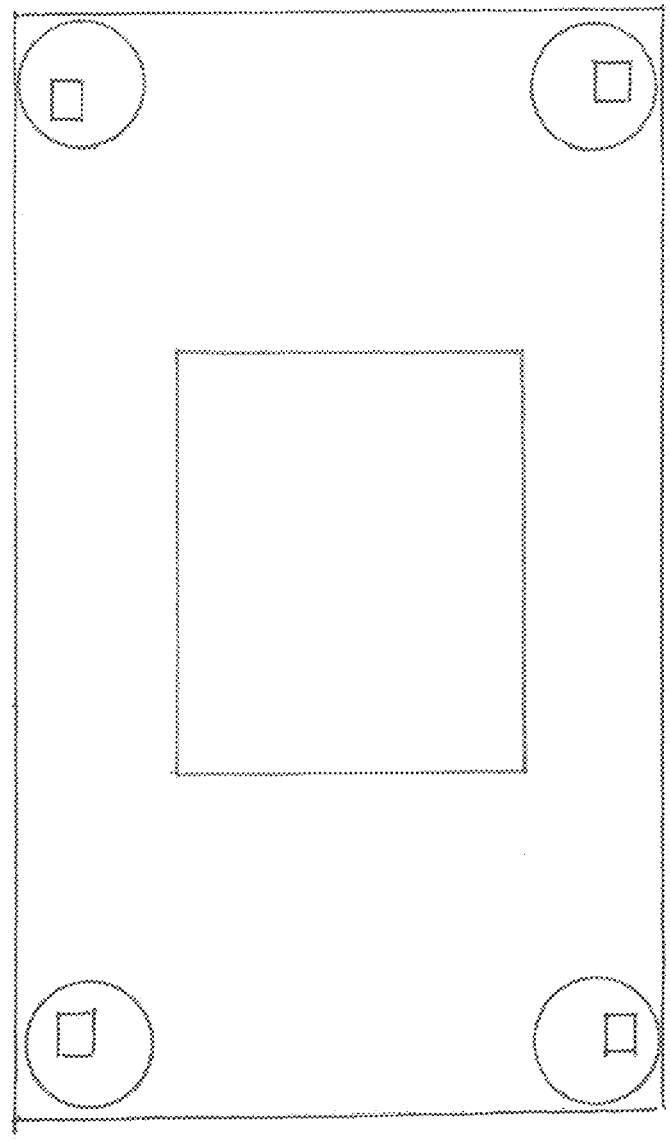

In a next step, as shown in FIGS. 4H and 4I, a magnetic material 460 can be filled into the empty portion of the dielectric layers and solder balls 370 can be applied onto exposed metallized portions of the redistribution structure 340.

Figures 5A, 5B, 5C:
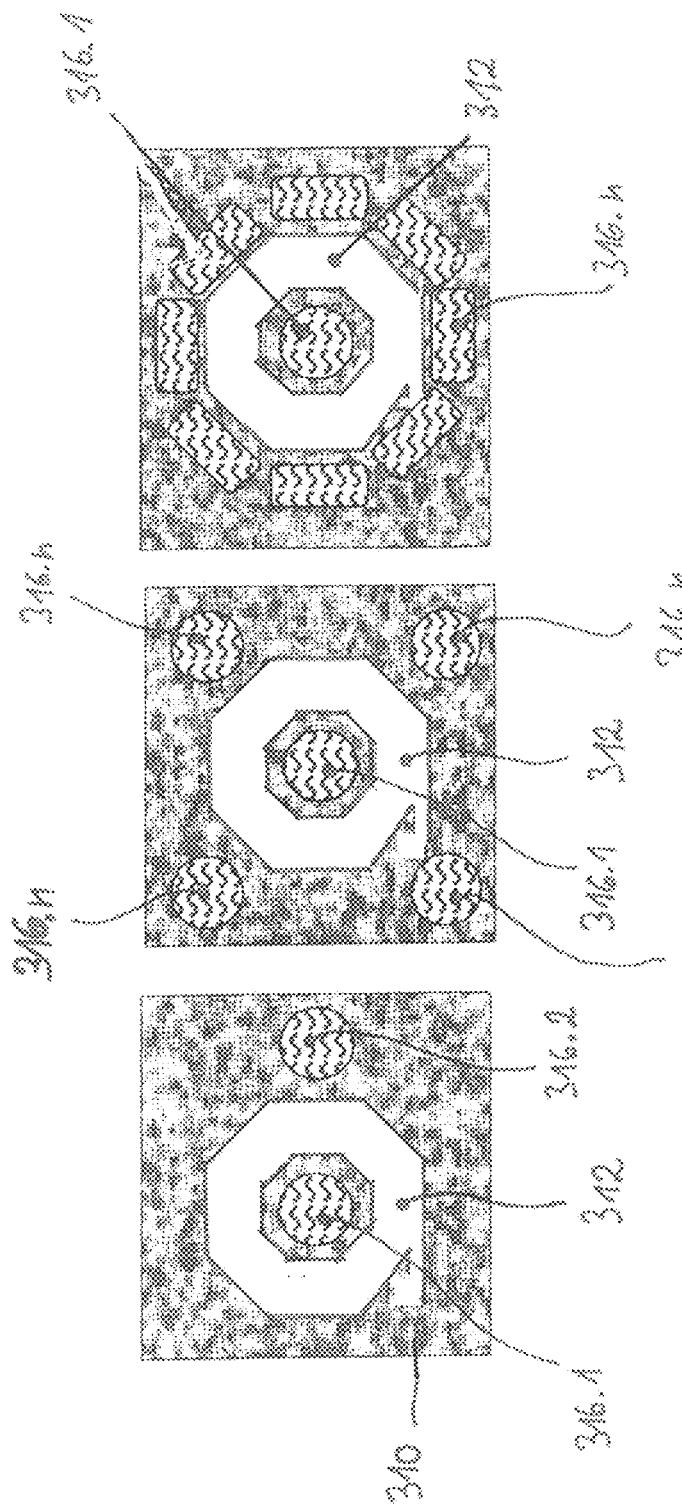
FIGS. 5A-5C, collectively

In FIGS. 5A-C different examples of semiconductor packages are illustrated, each one showing a partial sectional view in a horizontal plane of the inductor. The examples show different arrangements of holes filled with a magnetic material. FIG. 5A shows a first example comprising the inductor 312 and one central hole 316.1 comprising a space within the inductor 312, and a second hole 316.2 laterally besides the inductor. FIG. 5B shows the inductor 312, a central hole 316.1 within the inductor 312 and four non-central holes 316.n arranged on the corners of a square. FIG. 5C shows the inductor 312, a central hole 316.1 and eight holes 316.n circumferentially arranged around the inductor 312.

Figure 6A:
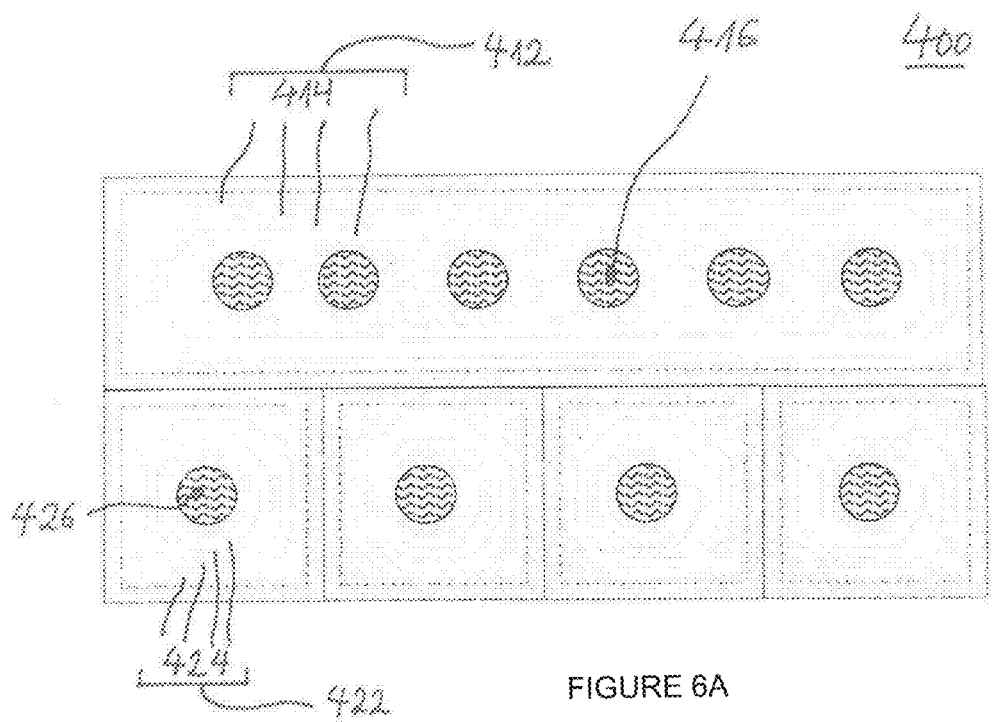
FIGS. 6A-B, collectively
Figure 6B:
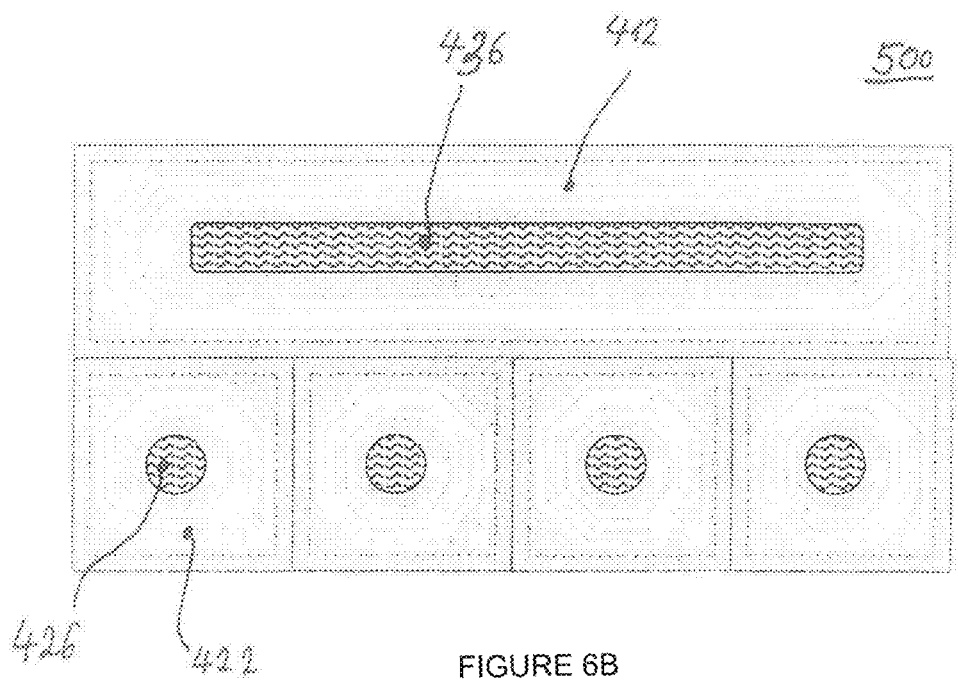

FIGS. 6A and 6B show different examples of transformers each one showing a partial sectional view in a horizontal plane of the transformer like FIG. 3B, FIG. 4FG, and FIGS. 5A-C. The transformer 400 shown in FIG. 6A comprises a first elongated inductor 412 integrated in a semiconductor chip 410 wherein the inductor windings 414 surround six spaces 416 which are filled with a magnetic material. Within the same horizontal plane four inductors 422 are arranged along a long side of the elongated inductor 412. Each one of the inductors 422 is comprised of windings 424 wherein the windings 424 surround one space 426 which is filled with a magnetic material. Above and below the plane in which the inductors 412 and 422 are arranged, magnetic material is provided (not shown) which is contiguous with the magnetic material disposed in the holes 416 and 426 so that magnetic winding cores are formed thereby.

The transformer 500 as depicted in FIG. 6B differs from the transformer 400 only in that the holes 416 of transformer 400 are combined to one elongated hole 436 filed with magnetic material.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A semiconductor package, comprising:
a semiconductor chip;
an inductor applied to the semiconductor chip, the inductor comprising at least one winding;

a magnetic material, wherein a space within the at least one winding is filled with the magnetic material;

at least one magnetic element located in a distance from the semiconductor chip so that the magnetic material and the magnetic element constitute a part of a magnetic winding core; and an encapsulation body disposed of a non-magnetic encapsulation material, the non-magnetic encapsulation material covering side faces of the semiconductor chip and a side face of the magnetic element facing the semiconductor chip.

2. The semiconductor package according to claim 1, wherein the space comprises a hole in the semiconductor chip.

3. The semiconductor package according to claim 1, wherein the semiconductor chip comprises a plurality of holes including one central hole and a plurality of non-central holes, wherein the central hole comprises the space within the at least one winding that is filled with the magnetic material.

4. The semiconductor package according to claim 3, wherein each hole of the plurality of holes is filled with the magnetic material.

5. The semiconductor package according to claim 3, wherein at least part of the non-central holes are situated symmetrically with respect to the central hole.

6. The semiconductor package according to claim 1, wherein the magnetic material comprises a polymer material embedded with magnetic particles.

7. The semiconductor package according to claim 1, wherein the magnetic element comprises a soft-magnetic material.

8. The semiconductor package according to claim 1, further comprising two magnetic elements located at a distance from the semiconductor chip in an opposed relationship to each other.

9. The semiconductor package according to claim 1, wherein magnetic material is also disposed outside of the at least one winding so that the magnetic material within the winding and the material outside the winding form at least a part of the magnetic winding core.

10. The semiconductor package according to claim 1, further comprising an electrical redistribution structure having at least one structured metal layer and one polymer layer, the redistribution structure extending over a main surface of the semiconductor chip.

11. The semiconductor package according to claim 1, wherein the semiconductor chip comprises a winding trench provided in a main semiconductor chip surface, the winding trench being filled with a metal material to form the at least one winding.

12. The semiconductor package according to claim 1, wherein the semiconductor package comprises a transformer comprising the inductor and a second inductor, the second inductor comprising a second winding, wherein a space within the second winding is filled with the magnetic material and wherein the magnetic materials of the inductor and the second inductor constitute a part of the magnetic winding core.

13. A method for fabricating a semiconductor package, the method comprising:
providing a semiconductor chip, the semiconductor chip comprising an inductor, the inductor having at least one winding;

filling a magnetic material into a space within the at least one winding;

arranging at least one magnetic element in a distance from the semiconductor chip so that the magnetic material and the magnetic element constitute a part of a magnetic winding core; and forming an encapsulation body of a non-magnetic encapsulation material, the encapsulation material covering side faces of the semiconductor chip and a side face of the magnetic element facing the semiconductor chip.

14. The method according to claim 13, wherein the semiconductor chip comprises a plurality of holes including one central hole and at least one non-central hole, the method further comprising filling the magnetic material into the central hole and the at least one non-central hole.

15. The method according to claim 13, further comprising:
applying a plurality of semiconductor chips to a carrier, each semiconductor chip including an inductor;
depositing the non-magnetic encapsulation material onto the plurality of semiconductor chips to form the encapsulation body; and
singulating the encapsulation body in at least two semiconductor packages.

16. The method according to claim 13, further comprising:
providing a semiconductor wafer comprising multiple functional chip regions;
applying the inductor having at least one winding to each functional chip region;
generating at least two holes into each functional chip region, one of the holes comprising the space within the winding to be filled with the magnetic material; and
separating the wafer into semiconductor chips.

17. A semiconductor package, comprising:
a semiconductor chip;
an inductor integrated in the semiconductor chip, the inductor comprising at least one winding;
a magnetic material, wherein the semiconductor chip comprises a hole extending through the winding, the hole being filled with the magnetic material;
at least one magnetic element located in a distance from the semiconductor chip so that the magnetic material and the magnetic element constitute a part of a magnetic winding core; and
an encapsulation body formed of a non-magnetic encapsulation material, the encapsulation material covering side faces of the semiconductor chip and a side face of the magnetic element facing the semiconductor chip.

18. The semiconductor package according to claim 17, wherein the hole is one of a plurality of through-holes extending from a first main face of the semiconductor chip to an opposite second main face of the semiconductor chip.

19. The semiconductor package according to claim 17, further comprising two magnetic elements located at a distance from the semiconductor chip and in an opposite relationship to each other so that the magnetic material and the magnetic elements constitute parts of magnetic winding cores.

20. The semiconductor package according to claim 17, wherein the magnetic material comprises a polymer material embedded with magnetic particles.

* * * * *